United States Patent
Kim (10) Patent No.: US 8,084,776 B2
(45) Date of Patent: Dec. 27, 2011

(54) LIGHT EMITTING DEVICE, LIGHT EMITTING DEVICE PACKAGE, AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/028,780

(22) Filed: Feb. 16, 2011

(65) Prior Publication Data

US 2011/0204401 A1 Aug. 25, 2011

(30) Foreign Application Priority Data

Feb. 25, 2010 (KR) .................. 10-2010-0017001
Feb. 25, 2010 (KR) .................. 10-2010-0017016

(51) Int. Cl.
*H01L 33/00* (2010.01)
(52) U.S. Cl. ................... 257/98; 257/E33.072
(58) Field of Classification Search ............ 257/98, 257/E33.072, E33.069, E33.068, E33.073
See application file for complete search history.

(56) References Cited

U.S. PATENT DOCUMENTS

| 7,453,098 | B2 | 11/2008 | Lai et al. |
| 2008/0142780 | A1 | 6/2008 | Bader et al. |
| 2010/0093123 | A1 | 4/2010 | Cho et al. |
| 2010/0314645 | A1 | 12/2010 | Kim |

FOREIGN PATENT DOCUMENTS

| JP | 9-214001 A | 8/1997 |
| JP | 2001-144321 A | 5/2001 |
| KR | 20-0370465 Y1 | 12/2004 |
| KR | 10-2007-0009673 A | 1/2007 |
| KR | 10-2007-0031351 A | 3/2007 |
| KR | 10-2008-0058954 A | 6/2008 |
| KR | 10-2009-0080218 A | 7/2009 |

*Primary Examiner* — Bradley K Smith
*Assistant Examiner* — Amar Movva
(74) *Attorney, Agent, or Firm* — Birch, Stewart, Kolasch & Birch, LLP (57) ABSTRACT

Disclosed are a light emitting device, a light emitting device package, and a lighting system. The light emitting device includes a conductive support member; a reflective layer on the conductive support member; a light emitting structure on the reflective layer including a first conductive semiconductor layer, a second conductive semiconductor layer, and an active layer between the first and second semiconductor layers; and an electrode on the first conductive semiconductor layer, wherein a distance between the active layer and the reflective layer satisfies $2 \cdot \Phi_1 + \Phi_3 = N \cdot 2\pi \pm \Delta$, $(0 \leq \Delta \leq \pi/2)$ in which the $\Phi_1$ represents a phase change value when light vertically traveling passes through the second conductive semiconductor layer, the $\Phi_3$ represents a phase change value when the light is reflected by the reflective layer, and the N represents a natural number, and wherein the distance between the reflective layer and the active layer includes a first distance in a first region overlapping with the electrode perpendicularly to the electrode and a second distance in a second region other than the first region, the first distance being different from the second distance.

20 Claims, 7 Drawing Sheets

LIGHT EMITTING DEVICE, LIGHT EMITTING DEVICE PACKAGE, AND LIGHTING SYSTEM

The present application claims priority of Korean Patent Application No. 10-2010-0017001 and 10-2010-0017016 filed on Feb. 25, 2010, which is hereby incorporated by reference in its entirety.

BACKGROUND

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps used, liquid crystal displays, electric signboards, and street lamps.

SUMMARY

The embodiment provides a light emitting device having a novel structure, a light emitting device package, and a lighting system.

The embodiment provides a light emitting device capable of improving light extraction efficiency, a light emitting device package, and a lighting system.

According to the embodiment, the light emitting device includes a conductive support member; a reflective layer on the conductive support member; a light emitting structure on the reflective layer including a first conductive semiconductor layer, a second conductive semiconductor layer, and an active layer between the first and second semiconductor layers; and an electrode on the first conductive semiconductor layer, wherein a distance between the active layer and the reflective layer satisfies $2 \cdot \Phi 1 + \Phi 3 = N \cdot 2\pi \pm \Delta$, $(0 \leq \Delta \leq \pi/2)$ in which the $\Phi 1$ represents a phase change value when light vertically traveling passes through the second conductive semiconductor layer, the $\Phi 3$ represents a phase change value when the light is reflected by the reflective layer, and the N represents a natural number, and wherein the distance between the reflective layer and the active layer includes a first distance in a first region overlapping with the electrode perpendicularly to the electrode and a second distance in a second region other than the first region, the first distance being different from the second distance.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a method of manufacturing the same, and a light emitting device package according to the embodiment will be described with reference to accompanying drawings.

Figure 1:
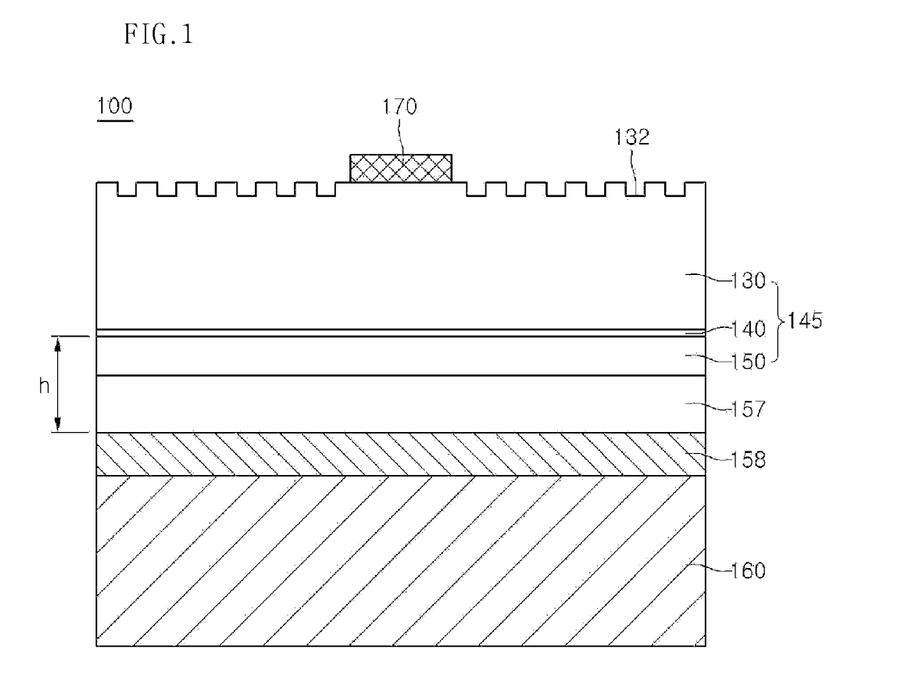
FIG. 1 is a side sectional view showing a light emitting device according to the first embodiment.

FIG. 1 is a side sectional view showing a light emitting device 100 according to the first embodiment.

Referring to FIG. 1, the light emitting device 100 according to the first embodiment includes a conductive support member 160, a reflective layer 158 on the conductive support member 160, an ohmic layer 157 on the reflective layer 158, a light emitting structure 145 including a first conductive semiconductor layer 130, an active layer 140, and a second conductive semiconductor layer 150 on the ohmic layer 157 to generate light, and an electrode 170 on the light emitting structure 145. The distance h between the active layer 140 and the reflective layer 158 satisfies $2 \cdot (\Phi 1 + \Phi 2) + \Phi 3 = N \cdot 2\pi \pm \Delta$, $(0 \leq \Delta \leq \pi/2)$.

In this case, $\Phi 1$ represents a phase change value when light vertically traveling passes through the second conductive semiconductor layer 150, $\Phi 2$ represents a phase change value when the light passes through the ohmic layer 157, $\Phi 3$ represents a phase change value when the light is reflected by the reflective layer 158, N represents a natural number, and $\Delta$ represents in the range of 0 to $\pi/2$.

The distance h is a value causing the constructive interference between light generated from the active layer 140 and light vertically incident onto the reflective layer 158 and reflected. In the light emitting device 100 according to the firs embodiment, light extraction efficiency can be improved by using the destructive interference of light.

In particular, the quantity of light extracted through a top surface of the light emitting structure 145 due to constructive interference is increased. Accordingly, the light extraction efficiency of the light emitting device can vary according to the period and height conditions of a light extraction pattern 132 formed on the top surface of the light emitting structure 145.

The embodiment discloses the distance h between the active layer 140 and the reflective layer 158 satisfying constructive interference and the period and height of the light extraction pattern 132 capable of extracting the most effectively light vertically traveling due to the constructive interference.

Hereinafter, the components and the operation of the light emitting device 100 will be described in detail.

The conductive support member 160 and the electrode 170 receive power from an external power source to supply power to the light emitting structure 145. Parts of the conductive support member 160 and the electrode 170 overlap with each other perpendicularly to each other to form a vertical electrode structure.

The conductive support member 160 can support the light emitting structure 145. For example, the conductive support member 160 may include at least one of titanium (Ti), chromium (Cr), nickel (Ni), aluminum (Al), platinum (Pt), gold (Au), tungsten (W), copper (Cu), molybdenum (Mo) and a carrier wafer (e.g., Si, Ge, GaAs, ZnO, SiC, SiGe, or GaN).

The electrode 170 may have various shapes to effectively spread current throughout the light emitting structure 145, and may include a pad such that a wire can be easily bonded. The electrode 170 may have a single layer structure or a multiple layer structure including at least one selected from the group consisting of Al, Ti, Cr, Ni, Cu, and Au.

The reflective layer 158 may be formed on the conductive support member 160. The reflective layer 158 reflects light from the light emitting structure 145, so that the light extraction efficiency of the light emitting device can be improved.

The reflective layer 158 may include metal including at least one selected from the group consisting of Ag, Al, Pd, and Pt, or the alloy thereof.

The ohmic layer 157 may make ohmic contact between the light emitting structure 145 serving as a compound semiconductor layer and the reflective layer 158. If the reflective layer 158 makes ohmic contact with the light emitting structure 145, the ohmic layer 157 may be not formed. In this case, the distance h between the reflective layer 158 and the active layer satisfies $2 \cdot \Phi 1 + \Phi 3 = N \cdot 2\pi \pm \Delta$, $(0 \leq \Delta \leq \pi/2)$.

The ohmic layer 157 may include metallic oxide and/or metallic nitride making ohmic contact with the second conductive semiconductor layer 150 while transmitting light. For example, the ohmic layer 157 may include at least one of ITO, IZO (Indium—Zinc—Oxide), AZO (Aluminum—Zinc—Oxide), MZO (Magnesium—Zinc—Oxide), GZO (Gallium—Zinc—Oxide), and ZnO.

Since the ohmic layer 157 is formed through a PECVD (Plasma Enhanced Chemical Vapor Deposition) scheme, an E-beam deposition scheme, or a sputtering scheme, the thickness of the ohmic layer 157 can be easily adjusted. Accordingly, the thickness of the ohmic layer 157 is adjusted, so that the distance h between the active layer 140 and the reflective layer 158 can be easily adjusted.

A CBL (Current Blocking Layer) may be formed between the ohmic layer 157 and the light emitting structure 145. A part of the CBL (not shown) overlaps with the electrode 170 perpendicularly to the electrode 170. The CBL (not shown) prevents current from being concentrated on the shortest path between the electrode 170 and the conductive support member 160, so that the light emission efficiency of the light emitting device 100 can be improved.

The light emitting structure 145 may be formed on the ohmic layer 157. The light emitting structure 145 may include the second conductive semiconductor layer 150, the active layer 140 on the second conductive semiconductor layer 150, and the first conductive semiconductor layer 130 on the active layer 140.

The first conductive semiconductor layer 130 may include an N type semiconductor layer, and the N type semiconductor layer may include a semiconductor material having a compositional formula of $In_xAl_yGa_{1-x-y}N$ ($0 \leq x \leq 1$, $0 \leq x+y \leq 1$). For example, the first conductive semiconductor layer 130 may be selected from the group consisting of InAlGaN, GaN, AlGaN, AlInN, InGaN, AlN, and InN and may be doped with N type dopants such as Si, Ge, and Sn.

The active layer 140 emits the light based on the band gap difference of the energy band according to material constituting the active layer 140 through the recombination of electrons (or holes) injected through the first conductive semiconductor layer 130 and holes (or electrons) injected through the second conductive semiconductor layer 150.

The active layer 140 may have a single quantum well structure, a multiple quantum well (MQW) structure, a quantum dot structure, or a quantum wire structure, but the embodiment is not limited thereto.

The active layer 140 may include semiconductor material having a compositional formula of $In_xAl_yGa_{1-x-y}N$ ($0 \leq x \leq 1$, $0 \leq y \leq 1$, $0 \leq x+y \leq 1$). If the active layer 140 has the MQW structure, the active layer 140 may have a stack structure of a plurality of well layers and a plurality of barrier layers. For example, the active layer 30 may include a stack structure of InGaN well/GaN barrier layers.

A clad layer (not shown) doped with N type dopants and P type dopants may be formed on and/or below the active layer 140, and may include an AlGaN layer or an InAlGaN layer.

The second conductive semiconductor 150 may be formed under the active layer 140. For example, the second conductive semiconductor layer 150 may include a P type semiconductor layer. The P type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the P type semiconductor layer may be selected from the group consisting of InAlGaN, GaN, AlGaN, InGaN, AlInN, AlN, and InN. The second conductive semiconductor layer 40 may be doped with P type dopants such as Mg, Zn, Ca, Sr, and Ba.

Differently, the first conductive semiconductor layer 130 may include a P type semiconductor layer, and the second conductive semiconductor layer 150 may include an N type semiconductor layer. In addition, a third conductive semiconductor layer (not shown) including an N type semiconductor layer or a P type semiconductor layer may be formed on the first conductive semiconductor layer 130. The light emitting device 100 may include at least one of an NP, PN, NPN, PNP junction structures. In addition, the doping concentration of impurities in the first and second conductive semiconductor layers 130 and 150 may be uniform or irregular. In other words, the light emitting structure 145 may have various structures, but the embodiment is not limited thereto.

The light extraction pattern 132 may be formed on the top surface of the first conductive semiconductor layer 130 of the light emitting structure 145. The light extraction pattern 132 may be formed in order to effectively extract light generated from the active layer 140, and may have random patterns or uniform patterns.

For example, the light extraction structure 132 may have a photonic crystal structure to effectively extract light having a specific wavelength region. The photonic crystal structure may be formed with a period in the range of about 50 nm to about 3000 nm.

Meanwhile, the light generated from the active layer 140 has an omni-directional characteristic. Accordingly, after the light generated from the active layer 140 is directed toward a top surface or a lateral surface of the light emitting structure 145 or downward from the light emitting structure 145 and reflected by the reflective layer 158, the light can be directed to the top surface or the lateral surface of the light emitting structure 145.

Lights having various directionalities are interfered with each other. Such interference phenomenon may be constructive interference to increase the intensity of the lights, or may be destructive interference to reduce the intensity of the light. In order to improve the light extraction efficiency, the light emitting device preferably has conditions of causing constructive interference therein.

Therefore, according to the embodiment, the distance h between the active layer 140 and the reflective layer 158, that is, the thickness of the ohmic layer 157 and the second conductive semiconductor layer 150 is adjusted such that the constructive interference smoothly occurs.

In detail, according to the embodiment, when the light generated from the active layer 140 is vertically incident onto the reflective layer 158, the distance h between the active layer 140 and the reflective layer 158 is adjusted such that the light reflected by the reflective layer 158 causes constructive interference with the light generated from the active layer 140.

In this case, the distance h is determined based on the condition for constructive interference between lights incident in a vertical direction because the ohmic layer 157 and the second conductive semiconductor layer 150 have a thickness of a few hundreds nm, so that lights approximately vertically pass through the ohmic layer 157 and the second conductive semiconductor layer 150.

The distance h between the active layer 140 and the reflective layer 158 may be determined in such a manner that the distance h satisfies following equation 1 to represent the condition for the constructive interference.

$$2\cdot(\Phi_1+\Phi_2)+\Phi_3 = N\cdot(2\pi\pm\Delta, (0\leq\Delta\leq\pi/2)) \qquad \text{Equation 1}$$

In this case, $\Phi_1$ represents a phase change value when light vertically traveling passes through the second conductive semiconductor layer 150, $\Phi_2$ represents a phase change value when the light passes through the ohmic layer 157, $\Phi_3$ represents a phase change value when the light is reflected by the reflective layer 158, N represents a natural number, and $\Delta$ represents in the range of 0 to $\pi/2$.

The $\Phi_1$ and $\Phi_2$ represent phase change values when light passes through media such as the second conductive semiconductor layer 150 and the ohmic layer 157, and may vary according to the wavelength of the light, and the refractive indexes and the thickness of the media through which the light passes. In detail, the phase change is represented as $\Phi=2\pi nd/\lambda$, in which n represents the refractive index of media through which light passes, $\lambda$ represents the wavelength of light, and d represents the thickness of the media through which the light passes. In other words, the $\Phi_1$ and $\Phi_2$ satisfy $\Phi_1=2\pi n_1 d_1/\lambda$ and $\Phi_2=2\pi n_2 d_2/\lambda$, respectively, in which the n1 represents the refractive index of the second conductive semiconductor layer, the n2 represents the refractive index of the ohmic layer, the d1 represents the thickness of the second conductive semiconductor layer, the d2 represents the thickness of the ohmic layer, and the $\lambda$ represents the wavelength of light emitted from the active layer.

If the second conductive semiconductor layer 150 includes GaN, the refractive index may be in the range of about 2.5 to about 2.7, and the thickness may be in the range of about 365 nm to about 445 nm.

If the second conductive semiconductor layer 150 includes AlN, the refractive index may be in the range of about 2.1 to about 2.3, and the thickness may be in the range of about 365 nm to about 445 nm.

In addition, $\Phi_3$ represents a phase change value when light is reflected by the reflective layer 158. Since the reflective layer 158 includes a material having density greater than that of the ohmic layer 157 or the second conductive semiconductor layer 150, the light reflected by the reflective layer 158 is subject to the reflection at a fixed end, so that the phase change is represented as $\pi+\alpha$. In other words, the phase change $\Phi_3$ may be represented as $\pi=180°$ in theory, but may vary with the deviation of $\alpha=2\pi d_3/\lambda$ according to the material constituting the reflective layer 158 and the surface shape of the reflective layer 158. The d3 may be identical to $1/(4\pi k/\lambda)$ (In this case, the d3 represents that the actual reflection region of the light may be changed when the surface of the reflective layer 158 has a roughness pattern, and the k represents the value of an imaginary part of the refractive index of the reflective layer 158).

In equation (1), the $\lambda$ may be in the range of 0 to $\pi/2$. In $\Delta=0$, the constructive interference is maximized. Even in $\leq\Delta\leq\pi/2$, the constructive interference is partially caused. In contrast, in $\pi/2\leq\Delta\leq\pi$, lights vertically traveling are weakened due to destructive interference.

Meanwhile, in order to obtain the constructive interference, the thickness of the active layer 140 is preferably less than or equal to $\lambda/n$ (n: refractive index of active layer, and $\lambda$: wavelength of light). If the thickness of the active layer 140 is greater than $\lambda/n$, light generated from one region of the active layer 140 causes constructive interference, and light generated from another region of the active layer 140 may occur destructive interference.

Hereinafter, light emission patterns represented according to the distance h between the active layer 140 and the reflective layer 158 according to the embodiment will be described.

Figure 2:
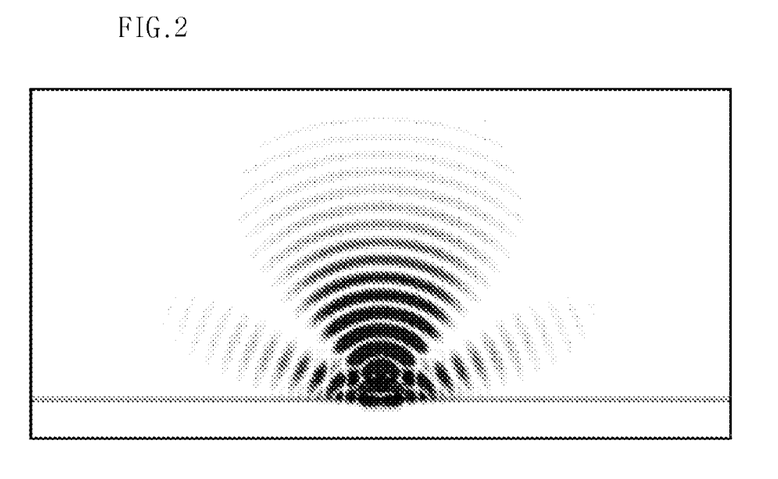
FIG. 2 is a view showing the emission pattern of light when the distance between an active layer and a reflective layer of the light emitting device satisfies the condition of constructive interference.
Figure 3:
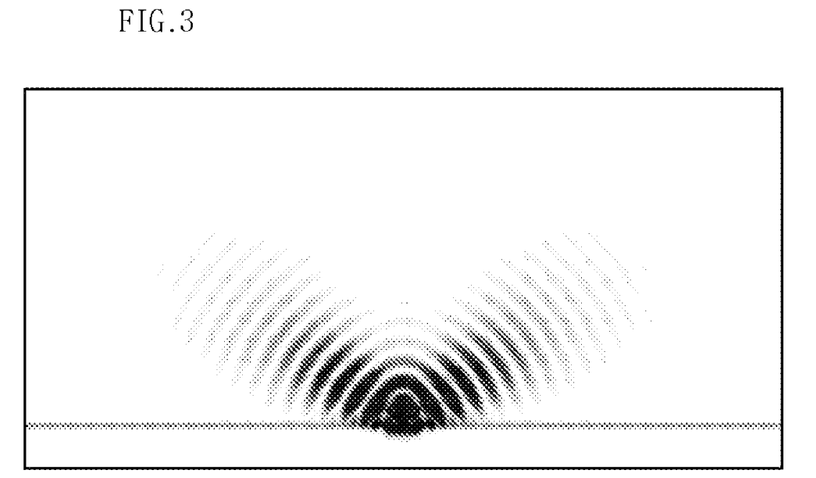
FIG. 3 is a view showing a light emission pattern when the distance between an active layer and a reflective layer of the light emitting device satisfies the condition of destructive interference.

FIG. 2 is a view showing a light emission pattern when the distance h between the active layer 140 and the reflective layer 158 satisfies the condition for constructive interference according to the embodiment, and FIG. 3 is a view showing a light emission pattern when the distance h between the active layer 140 and the reflective layer 158 satisfies the condition for the destructive interference.

Referring to FIG. 2, when the distance h between the active layer 140 and the reflective layer 158 satisfies the condition for the constructive interference, the quantity of light extracted in a vertical direction of the light emitting device is greater than the quantity of light extracted in the direction of a lateral surface of the light emitting device due to the constructive interference.

Referring to FIG. 3, when the distance h between the active layer 140 and the reflective layer 158 satisfies the condition for the destructive interference, the quantity of light extracted in a vertical direction of the light emitting device is less than the quantity of light extracted in the direction of a lateral surface of the light emitting device due to the destructive interference.

In other words, the light emission pattern and the light extraction efficiency of the light emitting device 100 according to the embodiment vary according to the distance between the active layer 140 and the reflective layer 158.

Accordingly, the distance h between the active layer 140 and the reflective layer 158 of the light emitting device according to the embodiment is adjusted to a distance satisfying the constructive interference, so that the light extraction efficiency of the light emission device 100 can be improved.

Figure 4:
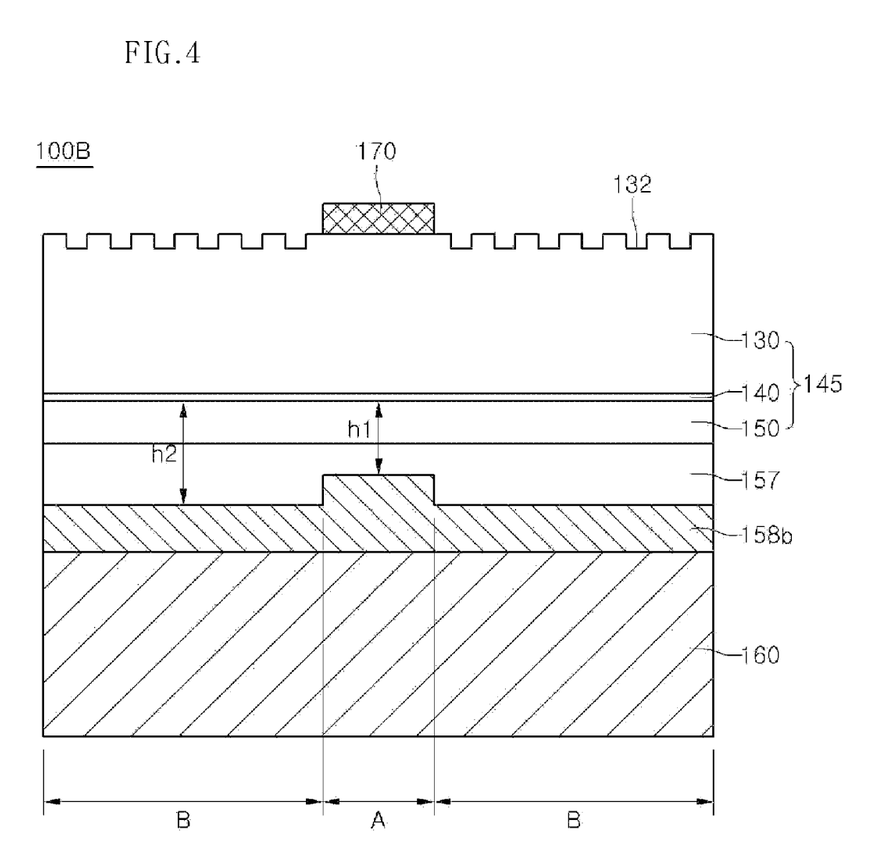
FIG. 4 is a side sectional view showing a light emitting device according to the second embodiment.

Hereinafter, a light emitting device 100B according to the second embodiment will be described in detail, and the structures or the components identical to those of the first embodiment will not be further described or will be described briefly.

FIG. 4 is a side sectional view showing the light emitting device 100B according to the second embodiment.

Referring to FIG. 4, the light emitting device 100B includes the conductive support member 160, the reflective layer 158b on the conductive support member 160, the ohmic layer 157 on the reflective layer 158b, the light emitting structure 145 including the first conductive semiconductor layer 130, the active layer 140 and the second conductive semiconductor layer 150 on the ohmic layer 157 to generate light, and the electrode 170 on the light emitting structure 145. Regarding the distance between the reflective layer 158b and the active layer 140, a first distance h1 in a first region overlapping with the electrode 170 perpendicularly to the electrode 170 may be different from a second distance h2 in a second region B.

In this case, the first distance h1 may satisfy the condition for destructive interference between light generated from the active layer 140 and the light reflected from the reflective layer 158b. The second distance h2 may satisfy the condition for the constructive interference between the light generated from the active layer 140 and the light reflected from the reflective layer 158b.

In detail, as shown in following equation (2), the first distance h1 satisfies $2 \cdot (\Phi1+\Phi2)+\Phi3=N \cdot 2\pi \pm \Delta1$, $(\pi/2 < \Delta1 < \pi)$, and the second distance h2 satisfies $2 \cdot (\Phi1+\Phi2)+\Phi3=N \cdot 2\pi \pm \Delta2$, $(0 \leq \Delta2 \leq \pi/2)$.

$$h1: 2 \cdot (\Phi1+\Phi2)+\Phi3=N \cdot 2\pi \pm \Delta1, (\pi/2 < \Delta1 < \pi)$$

$$h2: 2 \cdot (\Phi1+\Phi2)+\Phi3=N \cdot 2\pi \pm \Delta2, (0 \leq \Delta2 \leq \pi/2) \quad \text{Equation 2}$$

In this case, $\Phi1$ represents a phase change value when light vertically traveling passes through the second conductive semiconductor layer 150, $\Phi2$ represents a phase change value when the light passes through the ohmic layer 157, $\Phi3$ represents a phase change value when the light is reflected by the reflective layer 158b, and N represents a natural number. In addition, $\Delta1$ and $\Delta2$ have the ranges of $\pi/2 < \Delta1 < \pi$ and $0 \leq \Delta2 \leq \pi/2$, respectively. In the range of the $\Delta1$, destructive interference is strongly represented, and, in the range of $\Delta2$, constructive interference is strongly represented.

In this case, if the ohmic layer 157 is not formed, the h1 may satisfy $2 \cdot \Phi1+\Phi3=N \cdot 2\pi \pm \Delta1$, $(\pi/2 < \Delta1 < \pi)$, and the h2 satisfies $2 \cdot \Phi1+\Phi3=N \cdot 2\pi \pm \Delta2$, $(0 \leq \Delta2 \leq \pi/2)$.

According to the embodiment, the quantity of the loss of the light incident toward the electrode 170 from the active layer 140 can be reduced by employing different distances h1 and h2 in the first region A and the second region B between the active layer 140 and the reflective layer 158b.

In detail, as described above with reference to FIGS. 2 and 3, if the distance between the active layer 140 and the reflective layer 158b satisfies the condition for the constructive interference, light vertically emitted is strongly represented. If the distance between the active layer 140 and the reflective layer 158b satisfies the condition for the destructive interference, light emitted in the direction of the lateral surface of the light emitting device.

Accordingly, the distance between the active layer 140 and the reflective layer 158b is set to the first distance h1 satisfying the condition for the destructive interference in the case of the first region A overlapping the electrode 170 such that light emitted in the direction of a lateral surface is strongly represented. In addition, the distance between the active layer 140 and the reflective layer 158b is set to the second distance h2 satisfying the condition for the constructive interference in the case of the second region B. Accordingly, the quantity of light lost due to the absorption or scattering by the electrode 170 can be minimized, so that the light extraction efficiency of the light emitting device can be maximized.

Figure 5:
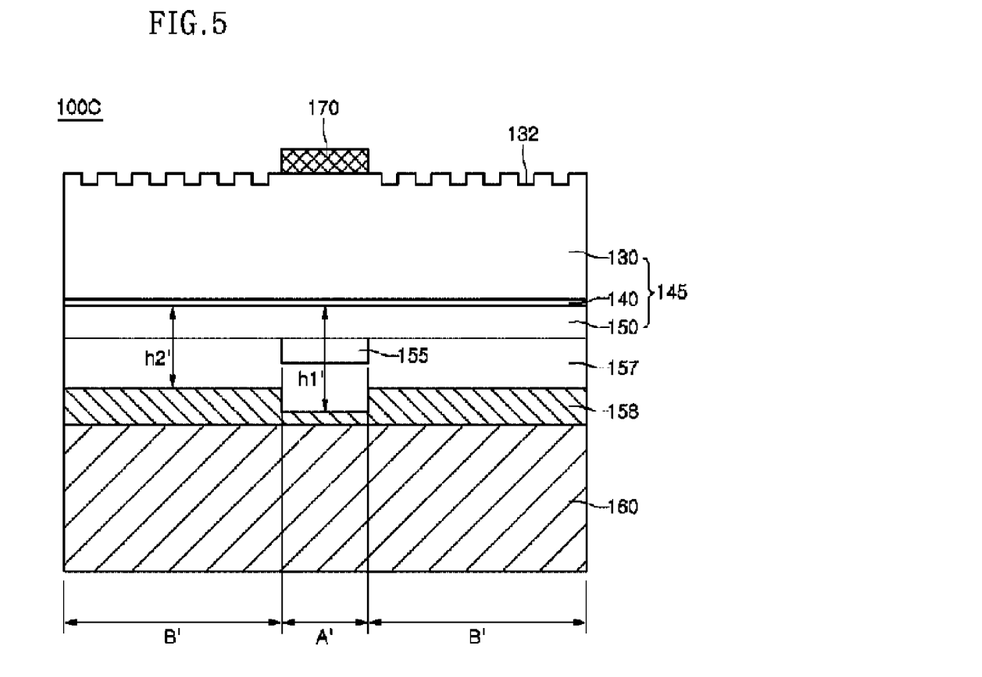
FIG. 5 is a side sectional view showing a light emitting device according to the third embodiment.

FIG. 5 is a side sectional view showing a light emitting device 100C according to the third embodiment.

Referring to FIG. 5, the light emitting device 100C according to the third embodiment includes the conductive support member 160, the reflective layer 158 on the conductive support member 160, the light emitting structure 145 including the first conductive semiconductor layer 130, the active layer 140, and the second conductive semiconductor layer 150 on the reflective layer 158 to generate light, a current blocking layer 155 between the second conductive semiconductor layer 150 and the reflective layer 158, and the electrode 170 on the light emitting structure 145. The distance between the active layer 140 and the reflective layer 158 includes a first distance h1' of a first region A1, in which the CBL 155 is formed, and a second distance h2' of a second region B' other than the first region A', which is different form the first distance h1'.

In this case, the first distance h1' may satisfy the condition for the destructive interference between the light generated from the active layer 140 and the light reflected from the reflective layer 158. The distance h2' may satisfy the condition for the constructive interference between the light generated from the active layer 140 and the light reflected from the reflective layer 158.

In detail, as shown in following equation 3, the distance h1' may satisfy $2 \cdot (\Phi1+\Phi2)+\Phi3=N \cdot 2\pi \pm \Delta1$, $(\pi/2 < \Delta1 < \pi)$, and the second distance h2' may satisfy $2 \cdot (\Phi1+\Phi2)+\Phi3=N \cdot 2\pi \pm \Delta2$, $(0 \leq \Delta2 \leq \pi/2)$.

$$h1': 2 \cdot (\Phi1+\Phi2)+\Phi3=N \cdot 2\pi \pm \Delta1, (\pi/2 < \Delta1 < \pi)$$

$$h2': 2 \cdot (\Phi1+\Phi2')+\Phi3=N \cdot 2\pi + \Delta2, (0 \leq \Delta2 \leq \pi/2) \quad \text{Equation 3}$$

In this case, $\Phi1$ represents a phase change value when light vertically traveling passes through the second conductive semiconductor layer 150, $\Phi2$ represents a phase change value when the light passes through the ohmic layer 157 and the CBL 155, $\Phi2'$ represents a phase change value when the light passes through the ohmic layer 157, $\Phi3$ represents a phase change value when the light is reflected by the reflective layer 158b, and N represents a natural number. In addition, $\Delta1$ and $\Delta2$ have the ranges of $\pi/2 < \Delta1 < \pi$ and $0 \leq \Delta2 \leq \pi/2$ respectively. In the range of the $\Delta1$, destructive interference is strongly represented such that the light emitted in a vertical direction is absorbed by the electrode 170, and, in the range of $\Delta2$, constructive interference is strongly represented.

Figure 6:
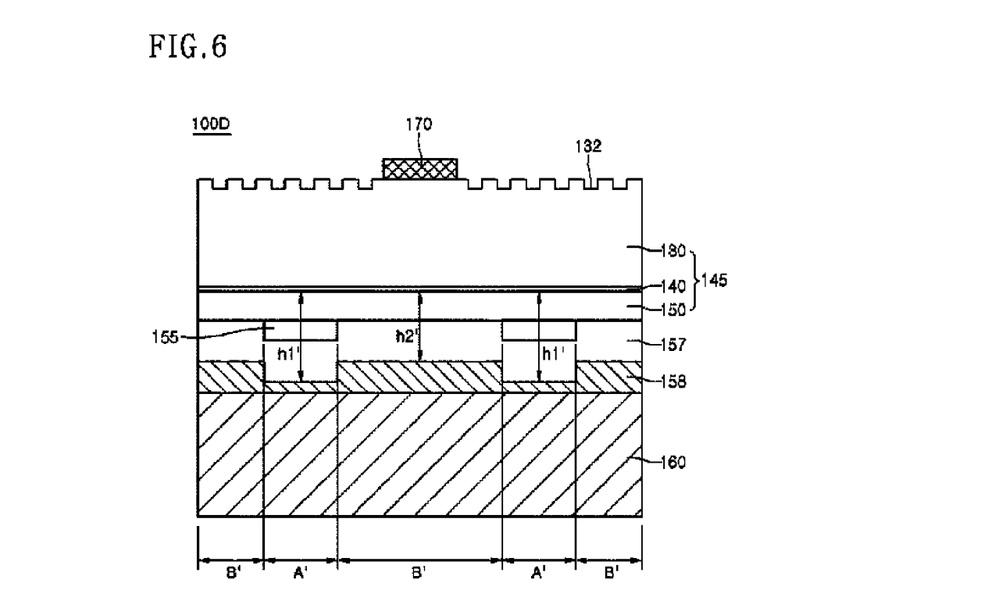
FIG. 6 is a side sectional view showing a light emitting device according to the fourth embodiment.

FIG. 6 is a side sectional view showing a light emitting device 100D according to the fourth embodiment.

The structure of FIG. 6 is identical to the structure of FIG. 5 except that the CBL 155 is not provided perpendicularly to the electrode 170. According to the present embodiment, differently from the third embodiment, the distance h1" between the active layer 140 and the reflective layer 158 is adjusted such that the constructive interference does not occur in the first region A' in which the CBL 155 is formed. In addition, the second distance h2" is preferably adjusted such that the destructive interference occur in the second region B' in order to reduce the quantity of light absorbed by the electrode 170.

Referring to FIG. 1, the light extraction pattern 132 may be formed on the top surface of the first conductive semiconductor layer 130 of the light emitting structure 145. The light extraction pattern 132 may be formed in order to effectively extract light, or may have a period.

The period of the light extraction pattern 132 may be in the range of $3 \cdot \lambda/n$ to $50 \cdot \lambda/n$, preferably, in the range of $8 \cdot \lambda/n$ to $12 \cdot \lambda/n$. In addition, the height of the light extraction pattern 132 may be at least $2 \cdot \lambda/n$. In this case, the $\lambda$ represents the wavelength of light generated from the active layer 140, and the n represents the refractive index of the light emitting structure 145.

If the period and the height of the light extraction pattern 132 satisfy the above condition, the light extracted through the top surface of the light emitting structure 145 mainly includes light in high order mode having a great period by the constructive interference, so that the light extraction efficiency can be improved.

In general, when two electro magnetic waves having different periods are interfered with each other, the period of an electro magnetic wave formed through the interference becomes the least common multiple between the periods of the two electro magnetic waves. For example, if the period of the first electro magnetic wave is 2, and if the period of the second electro magnetic wave is 3, the period of the third electro magnetic formed through the interference between the first and second electro magnetic waves becomes 6 which is the least common multiple between 2 and 3.

Through the above principle, light extracted from the light emitting device according to the embodiment based on constructive interference may mainly include the light in a high order mode having a great period. Therefore, according to the embodiment, the period and the height of the light extraction pattern 132 are formed as described above in such a manner that the period and the height are suitable for extracting the light in the high order mode. Accordingly, the light extraction efficiency of the light emitting device can be maximized.

Figure 7:
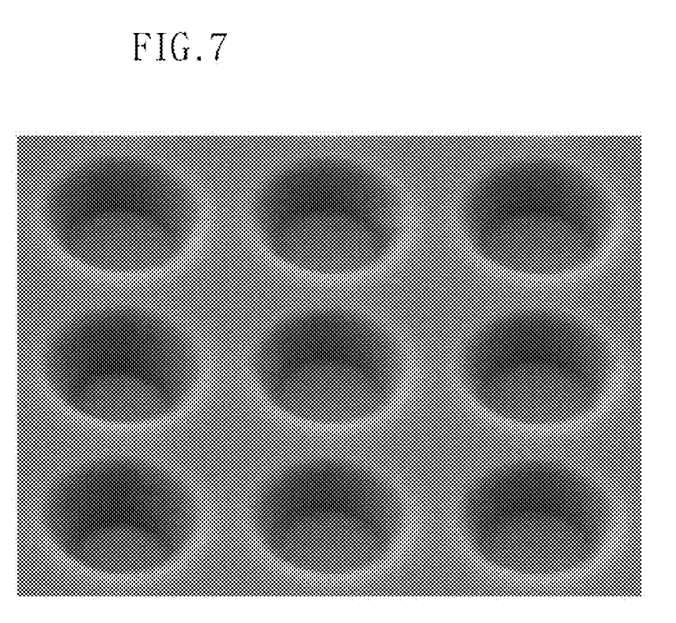
FIGS. 7 and 8 are views showing a light extraction pattern in the light emitting device of FIG. 1.
Figure 8:
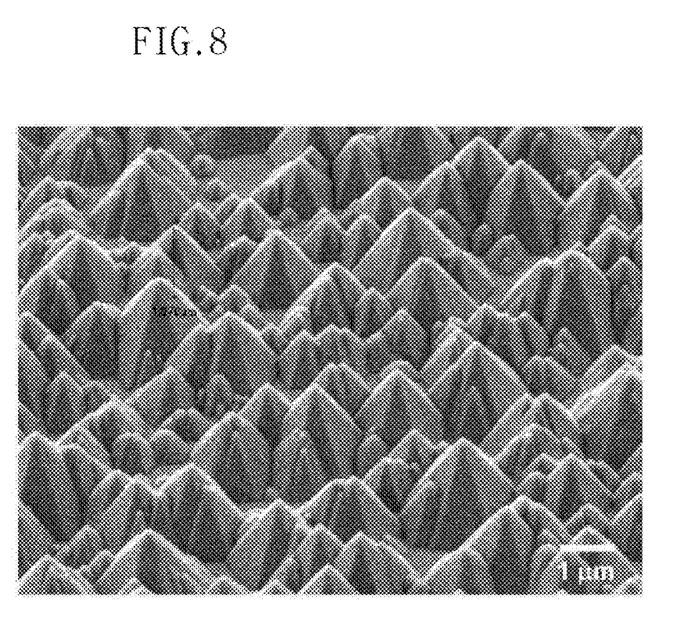

FIGS. 7 and 8 are views showing the light extraction pattern 132.

Referring to FIG. 7, the light extraction pattern 132 may have the shape of holes that are periodically formed.

In detail, as shown in FIGS. 7 and 8, the holes may have a polygonal prism shape, a conical shape, and a polygonal pyramid shape as well s a cylindrical shape.

In addition, the light extraction pattern 143 may have the shape of columns periodically formed. For example, the columns include a cylindrical shape and a polygonal prism shape.

Referring to FIG. 8, the light extraction pattern 132 not only includes periodic patterns, but includes random concavo-convex patterns or roughness patterns. In this case, the conditions of the wet etching process to form the concavo-convex patterns or the roughness patterns are adjusted in such a manner that average values in the distances between convex (concave) patterns and the heights of the convex patterns satisfy the above conditions.

Figure 9:
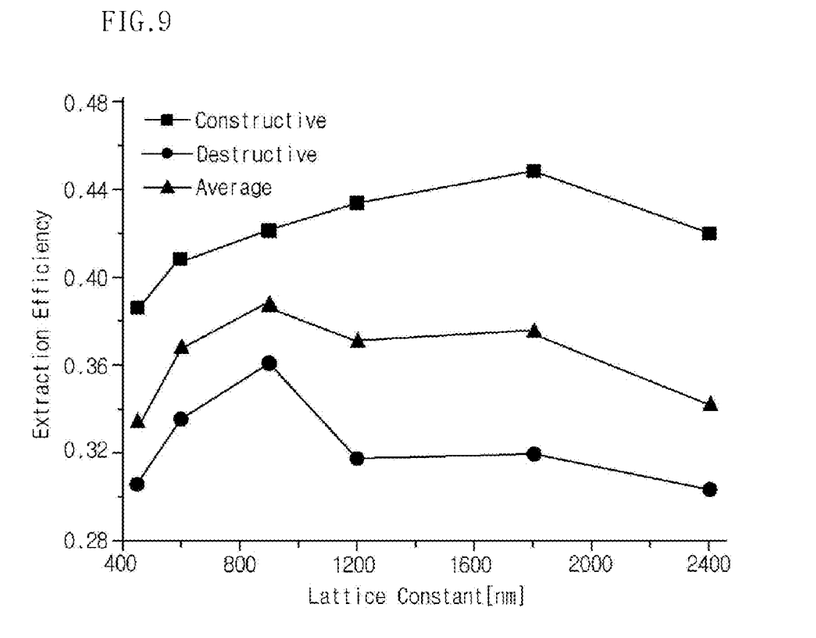
FIG. 9 is a graph showing extraction efficiency according to the variation in a period of the light extraction pattern of the light emitting device of FIG. 1.

FIG. 9 is a graph showing the extraction efficiency as a function of the period of the light extraction patterns 132 of the light emitting device according to the embodiment. As shown in FIG. 9, the experiment of FIG. 9 is performed under a condition in which the light generated from the active layer 140 is blue-based light having a wavelength of about 450 nm, the light emitting structure 145 includes a GaN-based semiconductor material, the height of the light extraction pattern 132 is 900 nm, the reflective layer 158 includes Ag, and the ohmic layer 157 includes ITO.

Referring to FIG. 9, if the distance h between the active layer 140 and the reflective layer 158 satisfies the condition for constructive interference, the extraction efficiency represents a high value when the light extraction pattern 132 has a period in the range of about 1600 nm to about 2000 nm.

In contrast, if the distance h satisfies the condition for the destructive interference, or the average condition of the constructive interference and the destructive interference, and if the light extraction pattern 132 has a period in the range of about 600 nm to about 1000 nm, the light extraction efficiency represents a high value.

In other words, as described above, if the distance h satisfies the condition for constructive interference, lights are extracted in a high order mode, in which lights have a period greater than that in the condition for destructive interference or the average condition, due to the constructive interference. Accordingly, the light extraction pattern 132 has a greater period.

In addition, when the experimental values of the light extraction pattern 132 are 1600 nm to 2000 nm, the experimental values satisfy $8 \cdot \lambda/n$ to $12 \cdot \lambda/n$. Accordingly, this is matched with the period of the light extraction pattern 132 described above.

Figure 10:
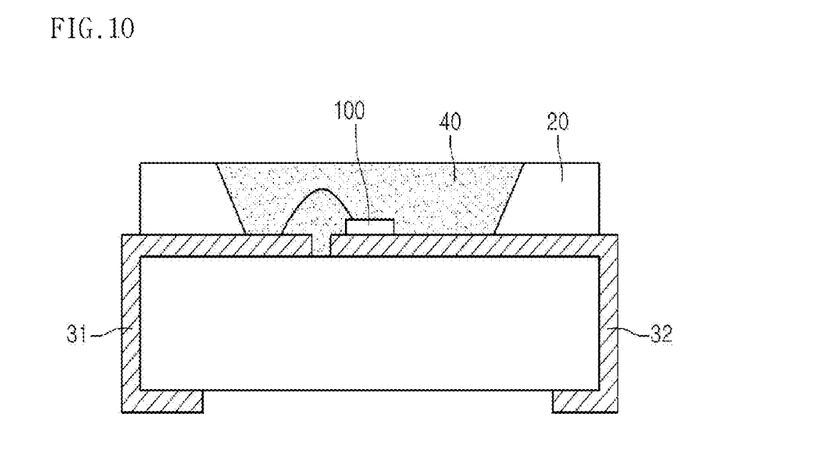
FIG. 10 is a sectional view showing a light emitting device package including a light emitting device according to the embodiment.

FIG. 10 is a sectional view showing a light emitting device package including a light emitting device according to the embodiment. Referring to FIG. 10, a light emitting device package 30 according to the embodiment includes a package body 20, first and second electrode layers 31 and 32 formed on the package body 20, the light emitting device 100 provided on the package body 20 and electrically connected to the first and second electrode layers 31 and 32 and a molding member 40 that surrounds the light emitting device 100.

The package body 20 may include silicon, synthetic resin or metallic material. The inclines surfaces may be formed in the package body 20 around the light emitting device 100.

The first and second electrode layers 31 and 32 are electrically isolated from each other and supply power to the light emitting device 100. The first and second electrode layer 31 and 32 may serve as a reflective plate to improve the light efficiency by reflecting the light emitted from the light emitting device 100. Further, the first and second electrode layers 31 and 32 may dissipate heat generated from the light emitting device 100 to the outside.

The light emitting device 100 can be installed on the package body 20 or one of the first and second electrode layers 31 and 32.

The light emitting device 100 can be electrically connected to one of the first and second electrode layers 31 and 32 through a wire scheme, a flip chip scheme or a die bonding scheme.

The molding member 40 surrounds the light emitting device 100 to protect the light emitting device 100. In addition, the molding member 40 may include luminescence material to change the wavelength of the light emitted from the light emitting device 100.

The light emitting device package may include at least one light emitting device according to the embodiments without limitations.

Figure 11:
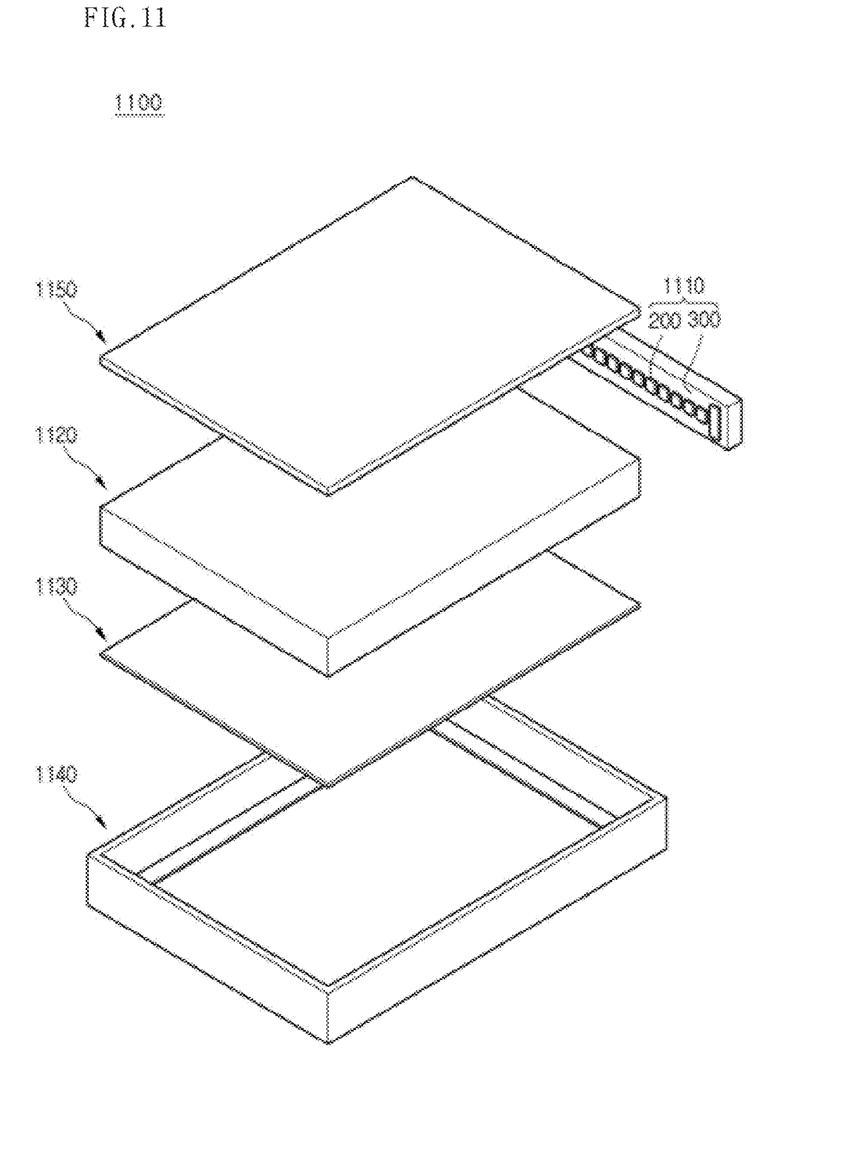
FIG. 11 is a view showing a backlight unit including a light emitting device or a light emitting device package according to the embodiment.

FIG. 11 is a view showing a backlight unit 1100 including the light emitting device package according to the embodiment. The backlight unit 1100 shown in FIG. 11 is an example of a lighting system and the embodiment is not limited thereto.

Referring to FIG. 11, the backlight unit 1100 may include a bottom frame 1140, a light guide member 1120 provided in the bottom frame 1140, and a light emitting module 1110 installed at one side or on the bottom surface of the light guide member 1120. In addition, a reflective sheet 1130 may be disposed under the light guide member 1120.

The bottom frame 1140 has a box shape having an open top surface to receive the light guide member 1120, the light emitting module 1110 and the reflective sheet 1130 therein. In addition, the bottom frame 1140 may include metallic material or resin material, but the embodiment is not limited thereto.

The light emitting module 1110 may include a substrate and a plurality of light emitting device packages mounted on the substrate according to the embodiments. The light emitting device packages can supply light to the light guide member 1120.

As shown in FIG. 11, the light emitting module 1110 is installed over at least one inner side of the bottom frame 1140 to provide the light to at least one side of the light guide member 1120.

In addition, the light emitting module 1110 can be provided under the bottom frame 1140 to provide the light toward the bottom surface of the light guide member 1120. Such an arrangement can be variously changed according to the design of the backlight unit 1100 and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include an LGP (light guide plate). For instance, the light guide plate can be manufactured by using acryl-based resin, such as PMMA (polymethyl methacrylate), PET (polyethylene terephthalate), COC, PC (polycarbonate) or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet 1150 uniformly diffuses the light emitted from the light emitting module 1110 such that the diffused light can be concentrated onto the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence materials.

The reflective sheet 1130 can be disposed under the light guide member 1120. The reflective sheet 1130 reflects the light, which is emitted through the bottom surface of the light guide member 1120, toward the light exit surface of the light guide member 1120.

The reflective sheet 1130 may include resin material having a high reflectance, such as PET, PC or PVC resin, but the embodiment is not limited thereto.

Figure 12:
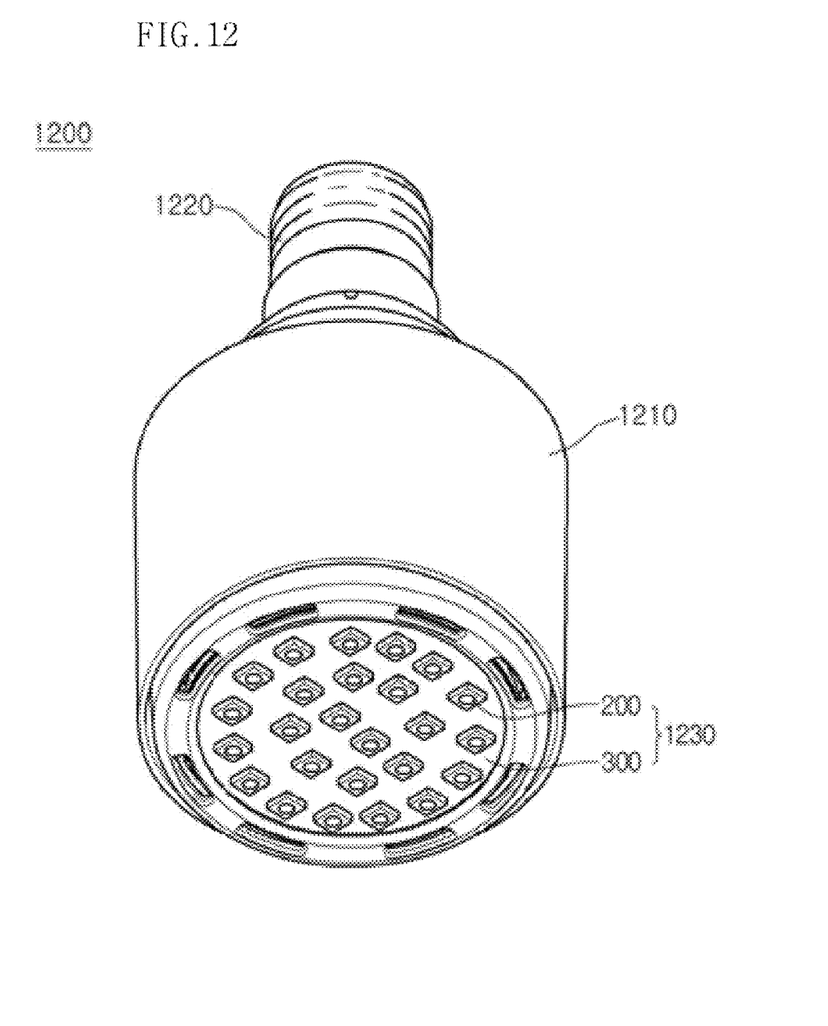
FIG. 12 is a view showing a lighting unit including a light emitting device or a light emitting device package according to the embodiment.

FIG. 12 is a perspective view showing a lighting unit 1200 including a light emitting device or a light emitting device package according to the embodiment. The lighting unit 1200 shown in FIG. 12 is only one example and the embodiment is not limited thereto.

Referring to FIG. 12, the lighting system 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include the substrate 300 and at least one light emitting device package 200 installed over the substrate 300.

The substrate 300 includes an insulating member printed with a circuit pattern. For instance, the substrate 300 includes a PCB (printed circuit board), an MC (metal core) PCB, a flexible PCB, or a ceramic PCB.

In addition, the substrate 300 may include material that effectively reflects the light. The surface of the substrate 300 can be coated with a color, such as a white color or a silver color, to effectively reflect the light.

At least one light emitting device package 200 can be installed over the substrate 300. Each light emitting device package 600 may include at least one LED (light emitting diode). The LED may include a colored LED that emits the light having the color of red, green, blue or white and a UV (ultraviolet) LED that emits UV light.

The light emitting module 1230 can be variously arranged to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence material. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 12, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support member;
a reflective layer on the conductive support member;
a light emitting structure on the reflective layer including a first conductive semiconductor layer, a second conductive semiconductor layer, and an active layer between the first and second semiconductor layers; and
an electrode on the first conductive semiconductor layer, wherein a distance between the active layer and the reflective layer satisfies $2\cdot\Phi1+\Phi3=N\cdot2\pi\pm\Delta$, $(0\leq\Delta\leq\pi/2)$ in which the $\Phi1$ represents a phase change value when light vertically traveling passes through the second conductive semiconductor layer, the $\Phi3$ represents a phase change value when the light is reflected by the reflective layer, and the N represents a natural number, and
wherein the distance between the reflective layer and the active layer includes a first distance in a first region overlapping with the electrode perpendicularly to the electrode and a second distance in a second region other than the first region, the first distance being different from the second distance.

2. The light emitting device of claim 1, further comprising an ohmic contact layer between the reflective layer and the second conductive semiconductor layer, wherein the distance between the active layer and the reflective layer satisfies $2\cdot(\Phi1+\Phi2)+\Phi3=N\cdot2\pi\pm\Delta$, $(0\leq\Delta\leq\pi/2)$ in which $\Phi2$ represents a phase change value when the light passes through the ohmic layer.

3. The light emitting device of claim 1, wherein the ohmic contact layer makes ohmic contact with the second conductive semiconductor layer while transmitting light.

4. The light emitting device of claim 1, wherein the $\Phi3$ is 180°.

5. The light emitting device of claim 1, wherein the active layer has a thickness less than or identical to $\lambda/n$, in which the n represents a refractive index of the active layer, and the $\lambda$ represents a wavelength of light generated from the active layer.

6. The light emitting device of claim 2, wherein the $\Phi1$ and $\Phi2$ satisfy $\Phi1=2\pi n_1 d_1/\lambda$ and $\Phi2=2\pi n_2 d_2/\lambda$, respectively, in which the $n_1$ represents a refractive index of the second conductive semiconductor layer, the $d_1$ represents a thickness of the second conductive semiconductor layer, the $d_2$ represents a thickness of the ohmic layer, and the $\lambda$ represents a wavelength of the active layer.

7. The light emitting device of claim 1, wherein the first distance satisfies a condition for destructive interference between vertically traveling lights generated from the active layer and reflected from the reflective layer, and the second distance satisfies a condition for constructive interference between the lights.

8. The light emitting device of claim 1, wherein the first distance satisfies $2\cdot(\Phi1+\Phi2)+\Phi3=N\cdot2\pi\pm\Delta1$, $(\pi/2<\Delta1<\pi)$, and the second distance satisfies $2\cdot(\Phi1+\Phi2)+\Phi3=N\cdot2\pi\pm\Delta2$, $(0\leq\Delta2\leq\pi/2)$ in which the $\Phi1$ represents a phase change value when light vertically traveling passes through the second conductive semiconductor layer, the $\Phi2$ represents a phase change value when the light passes through the ohmic layer, the $\Phi3$ represents a phase change value when the light is reflected by the reflective layer, and the N represents a natural number.

9. A light emitting device comprising:
A conductive support member;
a reflective layer on the conductive support member;
a light emitting structure on the reflective layer including a first conductive semiconductor layer, a second conductive semiconductor layer, and an active layer between the first and second semiconductor layers;
a light extraction pattern formed on a top surface of the first conductive semiconductor layer and a period in a range of $3\cdot\lambda/n$ to $50\cdot\lambda/n$; and
an electrode on the first conductive semiconductor layer, wherein a distance between the active layer and the reflective layer satisfies $2\cdot\Phi1+\Phi3=N\cdot2\pi\pm\Delta$, $(0\leq\Delta\leq\pi/2)$ in which the $\Phi1$ represents a phase change value when light vertically traveling passes through the second conductive semiconductor layer, the $\Phi3$ represents a phase change value when the light is reflected by the reflective layer, and the N represents a natural number.

10. The light emitting device of claim 9, further comprising an ohmic contact layer between the reflective layer and the second conductive semiconductor layer, wherein the distance between the active layer and the reflective layer satisfies $2\cdot(\Phi1+\Phi2)+\Phi3=N\cdot2\pi\pm\Delta$, $(0\leq\Delta\leq\pi/2)$ in which $\Phi2$ represents a phase change value when the light passes through the ohmic layer.

11. The light emitting device of claim 9, wherein the light extraction pattern has a height of at least $2\cdot\lambda/n$.

12. The light emitting device of claim 9, wherein the light extraction pattern has a period in a range $8\cdot\lambda/n$ of $12\cdot\lambda/n$.

13. The light emitting device of claim 9, wherein the light extraction pattern includes a random concave-convex pattern, and an average distance between convex (concave) patterns of the concavo-convex pattern has the period.

14. The light emitting device of claim 9, wherein, if the light generated from the active layer has a main wavelength of 450 nmm, and if the first conductive semiconductor layer, the active layer, and the second conductive semiconductor layer include a GaN-based semiconductor material, the light extraction pattern has a period in a range of 1600 nm to 2000 nm.

15. The light emitting device of claim 9, wherein the ohmic layer includes at least one selected from the group consisting of ITO (Indium—Tin—Oxide), IZO (Indium—Zinc—Oxide), AZO (Aluminum—Zinc—Oxide), MZO (Magnesium—Zinc—Oxide), GZO (Gallium—Zinc—Oxide), and ZnO.

16. The light emitting device of claim 9, wherein the active layer has a thickness less than or equal to $\lambda/n3$, in which the n3 represents a refractive index of the active layer, and the A represents a wavelength of the light.

17. The light emitting device of claim 10, wherein the $\Phi1$ and $\Phi2$ satisfy $\Phi1=2\pi n_1 d_1/\lambda$ and $\Phi2=2\pi n_2 d_2/\lambda$, respectively, in which the $n_1$ represents a refractive index of the second conductive semiconductor layer, the $d_1$ represents a thickness of the second conductive semiconductor layer, the $d_2$ represents a thickness of the ohmic layer, and the $\lambda$ represents a wavelength of the active layer.

18. A light emitting device comprising:
a reflective layer;
a light emitting structure including a second conductive semiconductor layer formed on the reflective layer, an active layer formed on the second conductive semiconductor layer, and a first conductive semiconductor layer formed on the active layer; and an electrode on the first conductive semiconductor layer,
wherein a distance between the active layer and the reflective layer satisfies $2 \cdot \Phi 1 + \Phi 3 = N \cdot 2\pi \pm \Delta$, ($0 \leqq \Delta \leqq \pi/2$) in which the $\Phi 1$ represents a phase change value when light vertically traveling passes through the second conductive semiconductor layer, the $\Phi 3$ represents a phase change value when the light is reflected by the reflective layer, and the N represents a natural number, and
wherein an ohmic contact layer is interposed between the reflective layer and the second conductive semiconductor layer, the ohmic contact layer makes ohmic contact with the second conductive semiconductor layer while transmitting light, and a current blocking layer is interposed between the second conductive semiconductor layer and the ohmic layer.

19. The light emitting device of claim 18, wherein the reflective layer includes at least one selected from the group consisting of Ag, Al, Pd, and Pt.

20. The light emitting device of claim 18, wherein the current blocking layer overlaps with the electrode perpendicularly to the electrode.

* * * * *